(12) United States Patent
Oka (10) Patent No.: US 6,551,906 B2
(45) Date of Patent: Apr. 22, 2003

(54) METHOD OF FABRICATING SEMICONDUCTOR DEVICE

(75) Inventor: Takahiro Oka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/734,557

(22) Filed: Dec. 13, 2000

(65) Prior Publication Data

US 2002/0048904 A1 Apr. 25, 2002

(30) Foreign Application Priority Data

Jul. 6, 2000 (JP) ........................................ 2000-204669

(51) Int. Cl.$^7$ ........................ H01L 21/301; H01L 21/46
(52) U.S. Cl. ........................ 438/465; 438/15; 438/113; 438/114; 438/460; 438/464; 438/458
(58) Field of Search ................ 438/460, 462, 438/464, 113, 114, 125, 15, 458, 459, 465, 976, 977

(56) References Cited

U.S. PATENT DOCUMENTS

| | | | | |
|---|---|---|---|---|
| 5,219,765 A | * | 6/1993 | Yoshida et al. ............... 438/10 |
| 5,824,177 A | * | 10/1998 | Yoshihara et al. ........... 156/250 |
| 5,851,664 A | * | 12/1998 | Bennett et al. .......... 428/355 BL |
| 6,004,833 A | * | 12/1999 | Kovats et al. ............... 438/107 |
| 6,060,373 A | * | 5/2000 | Saitoh ........................ 438/459 |
| 6,156,423 A | * | 12/2000 | Nagamoto et al. .......... 428/345 |
| 6,174,751 B1 | * | 1/2001 | Oka ........................... 438/113 |
| 6,338,980 B1 | * | 1/2002 | Satoh ......................... 438/106 |

FOREIGN PATENT DOCUMENTS

JP   11-204551   7/1999

* cited by examiner

*Primary Examiner*—Amir Zarabian
*Assistant Examiner*—Maria Guerrero
(74) *Attorney, Agent, or Firm*—Rabin & Berdo, PC (57) ABSTRACT

A method of fabricating a semiconductor device is provided in which a protective tape for back grinding is adhered to a front surface of a wafer and back grinding processing is carried out. Thereafter, with the protective tape for back grinding adhered to the wafer, a tape-shaped adhesive for dice bonding is adhered to a reverse surface of the wafer. Thereafter, the protective tape for back grinding is peeled off, probing is carried out, and a protective tape for dicing is adhered to the tape-shaped adhesive for dice bonding. After dicing, semiconductor elements, to which the tape-shaped adhesive for dice bonding is adhered, are picked up by a pick up tool. Dice bonding is carried out by using the tape-shaped adhesive for dice bonding. In this way, even if the wafer is made thin, the wafer doesn't break during the fabricating process and costs don't increase.

8 Claims, 7 Drawing Sheets

METHOD OF FABRICATING SEMICONDUCTOR DEVICE

BACKGROUND OF THE INVENTION

1. Field of the Invention

The present invention relates to a method of fabricating a semiconductor device.

2. Description of the Related Art

FIGS. 7A through 7H are cross-sectional views illustrating the fabricating processes until a wafer, at which are formed a plurality of semiconductor elements forming a widely used semiconductor, is separated into the respective semiconductor elements. These steps are as follows.

Figure 7A:
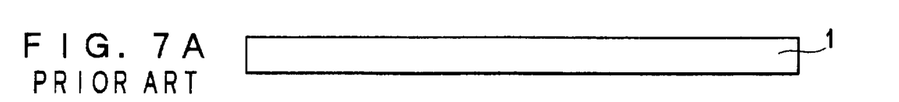
FIGS. 7A through 7H are cross-sectional views illustrating a conventional method of fabrication.

In FIG. 7A, a wafer 1 formed by a plurality of semiconductor elements is readied. Generally, the material of the wafer 1 is silicon.

Figure 7B:
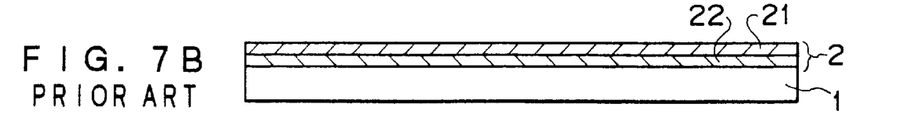

As shown in FIG. 7B, in order to cut the reverse surface of the wafer 1 to a desired thickness, a protective tape 2 for back grinding is adhered to the front surface (i.e., the surface at which the semiconductor elements are formed) of the wafer 1.

The protective tape 2 for back grinding is formed by a tape substrate 21 and an adhesive 22. In consideration of the method for conveying the wafer 1, the material and the thickness of the tape substrate 21 are such that the wafer 1 does not bend. A tacky resin, a UV-curing resin or the like is used for the adhesive 22.

Figure 7C:
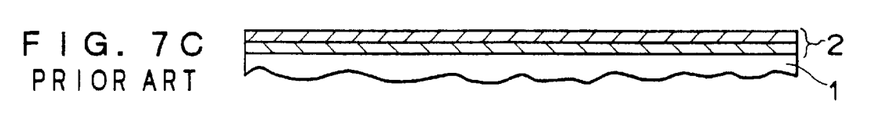
Figure 7D:
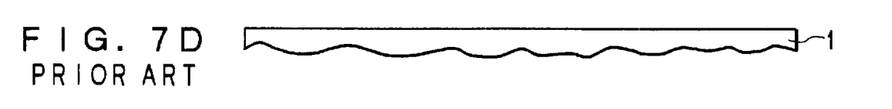

As shown in FIG. 7C, the wafer 1 is cut (subjected to back grinding processing) to a desired thickness by an unillustrated cutting device (back grinder). As shown in FIG. 7D, the protective tape 2 for back grinding is peeled off. When the adhesive 22 of the protective tape for back grinding is a tacky resin, the protective tape 2 is peeled off mechanically. When the adhesive 22 of the protective tape for back grinding is a UV-curing resin, the protective tape 2 is peeled off after being irradiated by UV light such that the adhesiveness of the protective tape 2 is deteriorated. Thereafter, the wafer 1 may be washed.

Figure 7E:
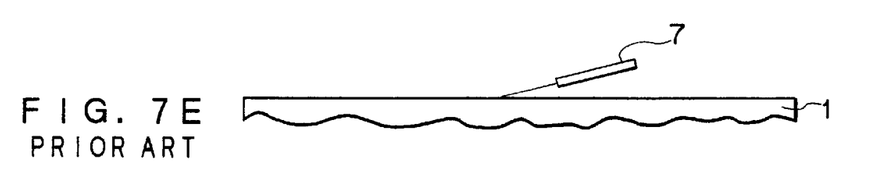

Next, in FIG. 7E, by using a probe needle 7 or the like, it is determined whether the wafer 1 has the desired electric characteristics. Namely, the wafers 1 are inspected (probed) and the good and bad wafers are discriminated by ink marking, mapping or the like.

Figure 7F:
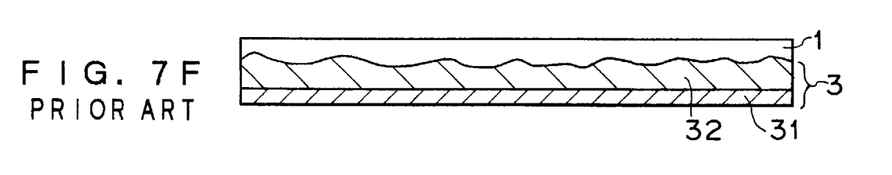

Thereafter, in order to divide (dice) the wafer 1 into the separate semiconductor elements formed thereon, as illustrated in FIG. 7F, a protective tape 3 for dicing is adhered to the reverse surface of the wafer 1.

The protective tape 3 for dicing is formed by a tape substrate 31 and an adhesive 32. UV-curing resin is widely used for the adhesive 32.

Figure 7G:
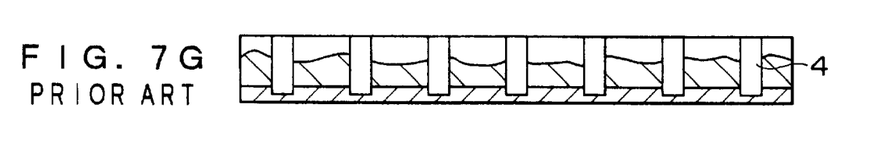

In FIG. 7G, cutting grooves 4, which are of a thickness such that they extend through the entire thickness of the wafer 1 and about one-half of the thickness of the protective tape 3 for dicing, are formed by a dicing device (not shown) such that the wafer 1 is divided into sizes of the respective semiconductor elements.

Figure 7H:
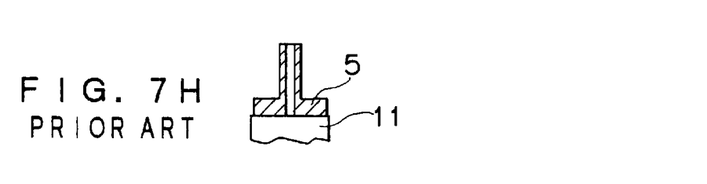

Then, the entire surface of the protective tape 3 for dicing is irradiated with UV light such that the adhesiveness of the protective tape 3 for dicing is deteriorated. Thereafter, as illustrated in FIG. 7H, separate semiconductor elements 11 and protective tape 3 for dicing are picked up with a pick up tool 5 of a dice bonding device, and the semiconductor elements 11 and the protective tape 3 for dicing are separated.

Thereafter, the dice bonding process is carried out, the assembly process is carried out, and packaging is thus completed. The dice bonding process and processes thereafter are well-known, and thus, description thereof will be omitted.

However, there are the following problems with the semiconductor device fabricated by this conventional method.

First of all, as background explanation, the size of wafers has gradually increased from 6 inch (about 150 mm) wafers and 8 inch (about 200 mm) wafers to 12 inch (about 300 mm) wafers, and accordingly, the thickness thereof has also become more thick. (6 inch wafers have a thickness of about 625 $\mu$m, whereas 8 inch wafers have a thickness of about 725 $\mu$m.)

However, because the wafer thickness (more correctly, chip thickness) is limited due to the package on which the semiconductor elements are placed, in order to not change the chip thickness, the amount of the wafer which is to be cut increases, and the mechanical strength of the wafer deteriorates.

Further, in recent years, the demand for thinner packages has increased, and in order to handle such a demand, wafers have had to be made thinner. For example, in order to place semiconductor elements on a thin package such as an IC card, the upper limit of the wafer thickness is about 150 $\mu$m.

In light of the above-described background, the following problems arise when the wafer is made thin (particularly to a level of 150 $\mu$m).

(1) When the protective tape for back grinding is peeled off after the back grinding processing of the wafer is completed, the wafer may break. Defects arise which ultimately result in an increase in costs.

(2) During probing which is carried out after the protective tape for back grinding has been peeled off, due to the pressure applied to the wafer by the probing needle, the wafer may break. Defects arise which ultimately result in an increase in costs.

(3) When the protective tape for dicing is adhered after probing, the wafer may break. Defects arise which ultimately result in an increase in costs.

(4) While the wafer is being conveyed during the above-described processes, due to the wafer bending or the like, the wafer may break. Defects arise which ultimately result in an increase in costs.

(5) As a countermeasure to such problems, the wafer (chip) has been made thick. Thus, it is difficult to apply such wafers to thin packages, and the other materials (particularly the package material covering the chip) have been made thinner, resulting in deterioration in quality such as a deterioration in moisture-resistance, soldering-resistance and the like.

SUMMARY OF THE INVENTION

In order to overcome the above-described problems, in accordance with the method of fabricating a semiconductor device of the present invention, after the protective tape for back grinding is adhered to the front surface of the wafer and back grinding processing is carried out, with the protective tape for back grinding still adhered, the tape-shaped adhesive for dice bonding is adhered to the reverse surface of the wafer which has been subjected to the back grinding processing, and through a dicing process or the like, dice bonding is carried out by using the tape-shaped adhesive for dice bonding.

In accordance with the present invention, the tape-shaped adhesive for dice bonding is adhered to the wafer which has been subjected to back grinding processing. Thus, the wafer can be prevented from breaking, the yield can be improved, and costs can be reduced. The wafer can be made thin and use of a thin package becomes possible, without the quality deteriorating. Further, a process for applying an adhesive at the time of dice bonding can be omitted.

BRIEF DESCRIPTION OF THE DRAWINGS

FIGS. 6A through 6H are cross-sectional views illustrating a sixth embodiment of the present invention.

DESCRIPTION OF THE PREFERRED EMBODIMENTS

FIGS. 1A through 1I are cross-sectional views illustrating a first embodiment of the present invention, and show steps of fabrication up to the stage of separating a wafer into separate semiconductor elements. These steps are as follows.

Figure 1A:
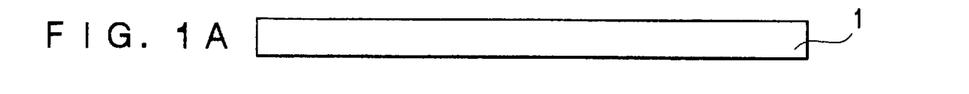
FIGS. 1A through 1I are cross-sectional views illustrating a first embodiment of the present invention.

In FIG. 1A, the wafer 1, at which a plurality of semiconductor elements are formed, is readied.

Figure 1B:
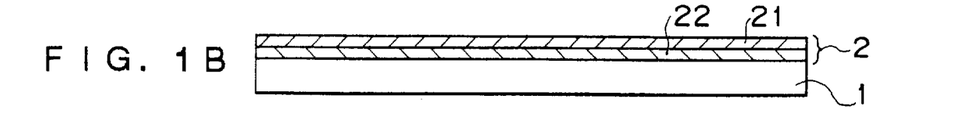

As shown in FIG. 1B, the protective tape 2 for back grinding is adhered to the front surface of the wafer 1 (the surface at which the semiconductor elements are formed) in order to cut the reverse surface of the wafer 1 to a predetermined thickness. The protective tape 2 for back grinding used at this time is formed by the tape substrate 21 and the adhesive 22. In consideration of the method of conveying the wafer and the like, the material and the thickness of the tape substrate 21 are selected such that the wafer does not bend A tacky resin, a UV-curing resin, or a thermoplastic resin may be used for the adhesive 22.

Figure 1C:
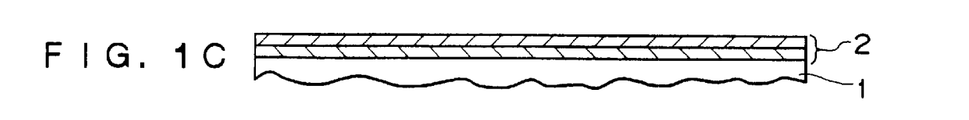

As shown in FIG. 1C, the wafer is cut (subjected to back grinding processing) to a predetermined thickness by an unillustrated cutting device.

Figure 1D:
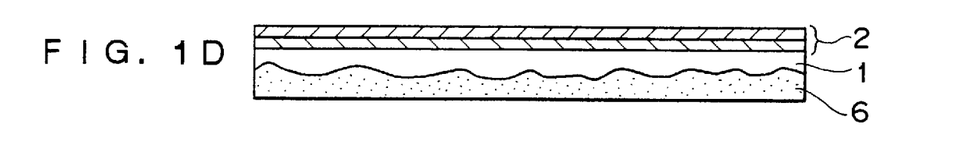

As shown in FIG. 1D, with the protective tape 2 for back grinding still adhered, a tape-shaped adhesive 6 for dice bonding is adhered to the reverse surface of the wafer 1 for which back grinding processing has been completed. A thermoplastic resin or the like is used for the tape-shaped adhesive 6 for dice bonding.

Figure 1E:
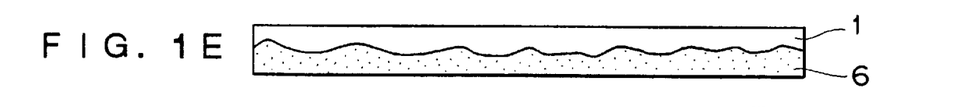

Thereafter, as illustrated in FIG. 1E, the protective tape 2 for back grinding is peeled off. When the adhesive 22 of the protective tape 2 for back grinding is a tacky resin, the protective tape 2 for back grinding is peeled off mechanically. When the adhesive 22 of the protective tape 2 for back grinding is a UV curing resin, the protective tape 2 for back grinding is peeled off after being irradiated with UV light. When the adhesive 22 of the protective tape 2 for back grinding is a thermoplastic resin, the protective tape 2 for back grinding is peeled off after being heated such that the adhesiveness thereof is lowered. Thereafter, the wafer 1 may be washed.

Figure 1F:
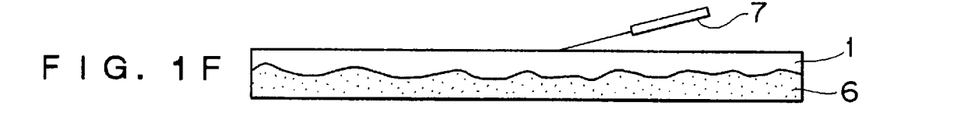

Next, in FIG. 1F, by using a probe needle 7 or the like, the wafer 1 is inspected (probed) to determine whether the wafer 1 has the desired electric characteristics. The good and bad wafers are discriminated by ink marking, mapping or the like.

Figure 1G:
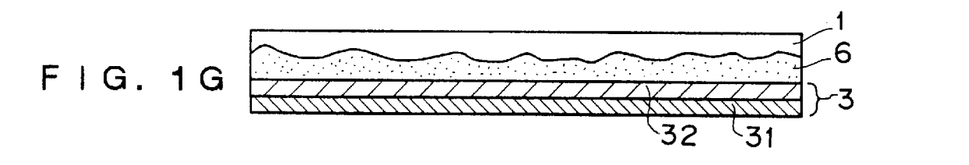

Thereafter, in order to divide (dice) the wafer 1 into the separate semiconductor elements formed thereon, as illustrated in FIG. 1G, the protective tape 3 for dicing is adhered to the reverse surface of the cut wafer 1. The protective tape 3 for dicing is formed by the tape substrate 31 and the adhesive 32. A UV-curing resin, which is widely used, is used for the adhesive 32.

Figure 1H:
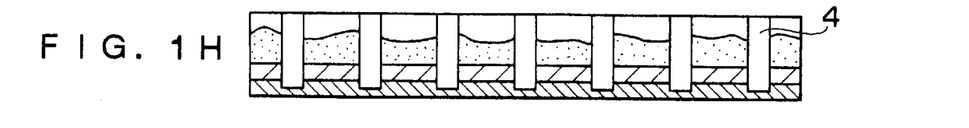

In FIG. 1H, the cutting grooves 4, which are of a thickness such that they extend through the entire thickness of the wafer 1, the entire thickness of the tape-shaped adhesive 6 for dice bonding, and about one-half of the thickness of the protective tape 3 for dicing, are formed by a dicing device (not shown) such that a portion of the substrate 31 of the protective tape 3 for dicing remains and the wafer 1 is divided into sizes of the respective semiconductor elements.

Figure 1I:
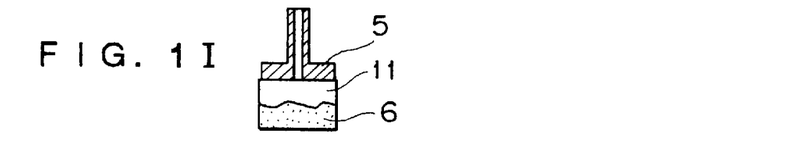

Then, the entire surface of the protective tape 3 for dicing is irradiated with UV light such that the adhesiveness of the protective tape 3 for dicing is deteriorated. Thereafter, as illustrated in FIG. 1I, the individual semiconductor elements 11, with the tape-shaped adhesive 6 for dice bonding adhered thereto, are picked up with the pick up tool 5 of a dice bonding device and are separated from the protective tape 3 for dicing.

Thereafter, although unillustrated, a dice bonding process is carried out on the semiconductor elements 11. Heat is applied such that dice bonding is carried out by the adhesion of the tape-shaped adhesive 6 for dice bonding.

Thereafter, a known assembly process is carried out, and packaging is thus completed.

In accordance with the first embodiment, the following effects are obtained.

(1) After the wafer has been subjected to back grinding processing to a desired thickness, because the tape-shaped adhesive for dice bonding is adhered to the wafer, the tape-shaped adhesive for dice bonding reinforces the wafer. Even if the wafer is thin (particularly at the level of 150 μm; hereinafter "thin" will refer to such a thickness), breakage of the wafer when the protective tape for back grinding is peeled can be suppressed. Defects do not arise, and as a result, costs can be decreased.

(2) When probing is carried out, because the tape-shaped adhesive for dice bonding is adhered to the wafer, the tape-shaped adhesive for dice bonding reinforces the wafer. Even if the wafer is thin, breakage of the wafer can be suppressed. Defects do not arise, and as a result, costs can be decreased.

(3) When conveying the wafer through the respective processes, because the tape-shaped adhesive for dice bonding is adhered to the wafer, the tape-shaped adhesive for dice bonding reinforces the wafer. Even if the wafer is thin, breakage of the wafer can be suppressed. Defects do not arise, and as a result, costs can be decreased.

(4) Because the wafer can be made thin, there is no need to make the wafer (the chip) thick, and thin packaging of the semiconductor elements is possible. Because there is no need to make the other materials (especially the package material covering the chip) thin, the quality, such as the moisture resistance, soldering resistance and the like, does not deteriorate.

(5) Because the tape-shaped adhesive for dice bonding is adhered to the wafer, there is no need to apply an adhesive when the semiconductor elements are dice bonded.

FIGS. 2A through 2G are cross-sectional views illustrating a second embodiment of the present invention, and show steps of fabrication up to the stage of separating a wafer into separate semiconductor elements. These steps are as follows.

Figure 2A:
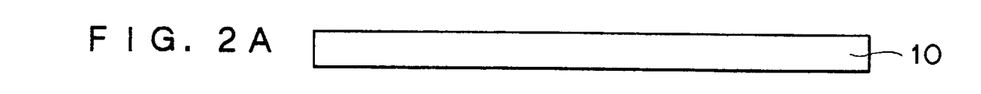
FIGS. 2A through 2G are cross-sectional views illustrating a second embodiment of the present invention.

In FIG. 2A, a wafer 10, at which a plurality of semiconductor elements are formed and for which probing has been completed, is readied. In this case, the wafer at which a plurality of semiconductor elements are formed may be readied and probing may be carried out thereafter. Or, probing may be carried out at any of the steps in the process of preparing the wafer at which a plurality of semiconductor elements are formed.

Accordingly, it is determined (i.e., probing is carried out to determine) whether the semiconductor elements on the wafer 10 have the desired electric characteristics. The good and bad semiconductor elements are discriminated by ink marking, mapping or the like.

Figure 2B:
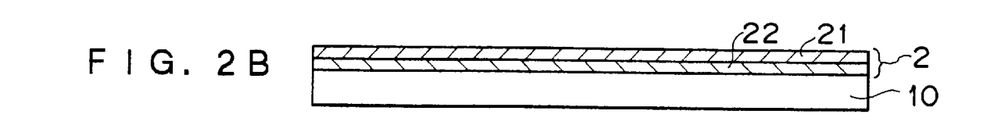

As shown in FIG. 2B, the protective tape 2 for back grinding is adhered to the front surface of the wafer 10 for the cutting of the reverse surface of the wafer 10 to a desired thickness. The protective tape 2 for back grinding used at this time is formed by the tape substrate 21 and the adhesive 22.

Figure 2C:
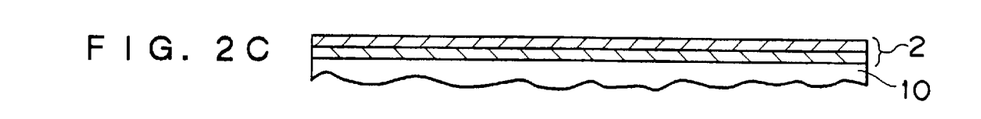

As shown in FIG. 2C, the wafer is cut to a predetermined thickness by an unillustrated cutting device.

Figure 2D:
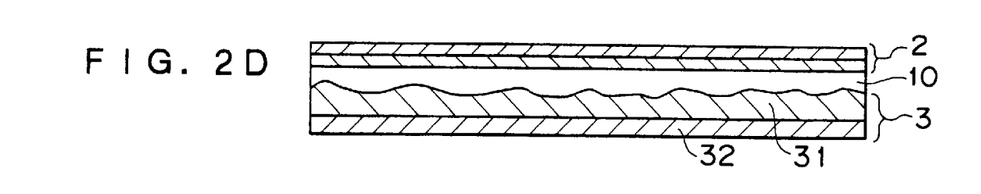

As shown in FIG. 2D, with the protective tape 2 for back grinding still adhered, the protective adhesive 3 for dicing is adhered to the reverse surface of the cut wafer 10, in order to separate the wafer 10 into the respective semiconductor elements formed thereon. The protective adhesive 3 for dicing is formed by the tape substrate 31 and the adhesive 32. A UV-curing resin which is widely used is used for the adhesive 32.

Figure 2E:
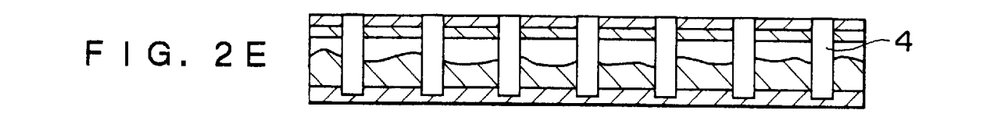

Thereafter, as illustrated in FIG. 2E, the cutting grooves 4, which are of a thickness such that they extend through the entire thickness of the wafer 10 and about one-half of the thickness of the protective tape 3 for dicing, are formed by a dicing device (not shown) such that the wafer 10 is divided into sizes of the respective semiconductor elements. Accordingly, the protective tape 2 for back grinding must be transparent to the extent that the scribe lines, which are provided for dividing the wafer 10 into the respective chips, can be seen.

Figure 2F:
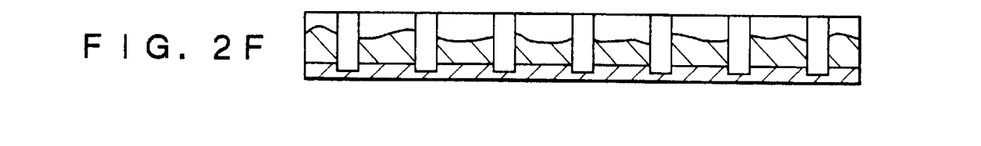

Then, in FIG. 2F, the protective tape 2 for back grinding adhered to the respective chips is peeled off therefrom by using a tool for peeling or the like.

Figure 2G:
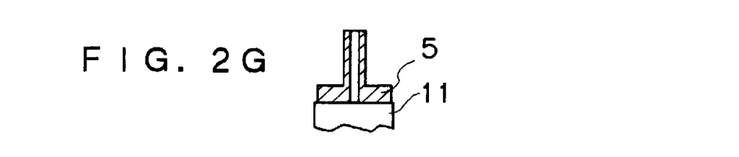

Next, UV light is irradiated onto the entire surface of the protective tape 3 for dicing such that the adhesiveness of the protective tape 3 for dicing deteriorates. Thereafter, as illustrated in FIG. 2G, the separate semiconductor elements 11 are picked up with the pick up tool 5 of a dice bonding device, and the semiconductor elements 11 are separated from the protective tape 3 for dicing.

Thereafter, a dice bonding process is carried out on the semiconductor elements 11. The assembly process is carried out, and packaging is completed. Description of the dice bonding processes and processes thereafter will be omitted.

In accordance with the second embodiment, the following effects are obtained.

(1) The probing is completed in steps before back grinding is carried out. Thus, the wafer is still thick during probing, and breakage of the wafer due to pressure applied thereto from the probing needle can be prevented. Defects do not arise, and as a result, costs can be decreased.

(2) After the wafer has been subjected to back grinding processing to a desired thickness, because the protective tape for dicing is adhered to the wafer, the protective tape for dicing reinforces the wafer. Even if the wafer is thin, breakage of the wafer when the protective tape for back grinding is peeled off can be suppressed. Defects do not arise, and as a result, costs can be decreased.

(3) When conveying the wafer through the respective processes, because the protective tape for back grinding and the protective tape for dicing are adhered to the wafer, the wafer is reinforced. Even if the wafer is thin, breakage of the wafer can be prevented. Defects do not arise, and as a result, costs can be decreased.

(4) Because the wafer can be made thin, there is no need to make the wafer (the chip) thick, and thin packaging of the semiconductor elements is possible. Because there is no need to make the other materials (especially the package material covering the chip) thin, the quality, such as the moisture resistance, soldering resistance and the like, does not deteriorate.

FIGS. 3A through 3G are cross-sectional views illustrating a third embodiment of the present invention, and show steps of a fabricating process up to the stage of separating a wafer into separate semiconductor elements. These steps are as follows.

FIGS. 3A through 3D are the same as the second embodiment, and thus, description thereof will be omitted.

Figure 3A:
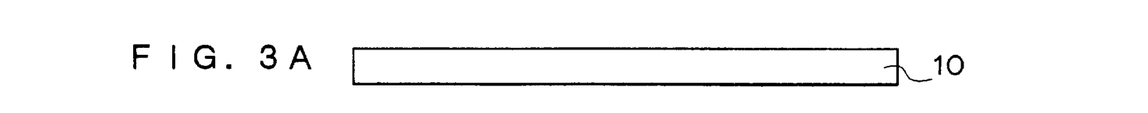
FIGS. 3A through 3G are cross-sectional views illustrating a third embodiment of the present invention.
Figure 3B:
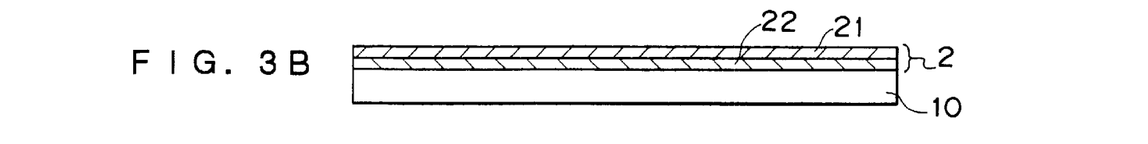
Figure 3C:
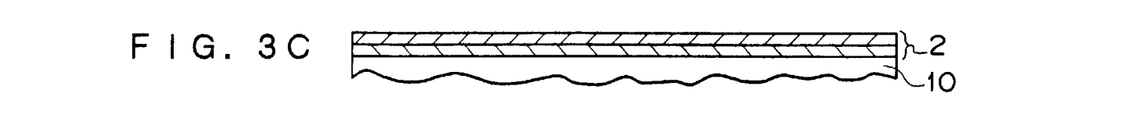
Figure 3D:
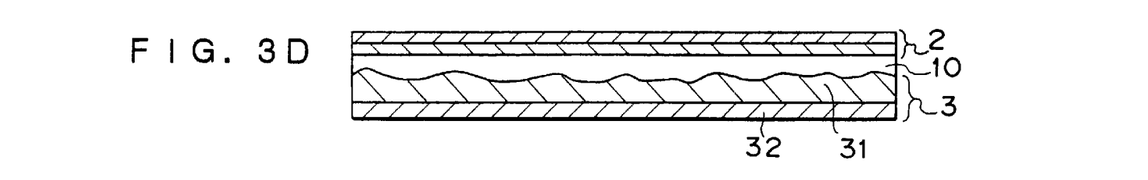
Figure 3E:
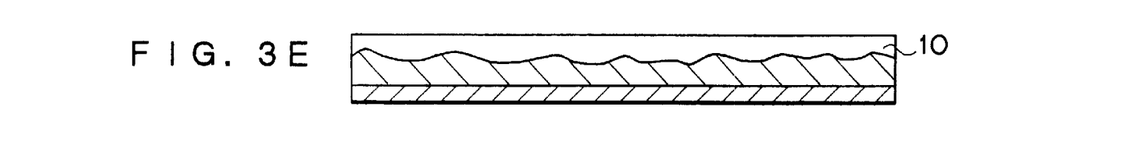

In FIG. 3E, the protective tape 2 for back grinding is peeled off.

Figure 3F:
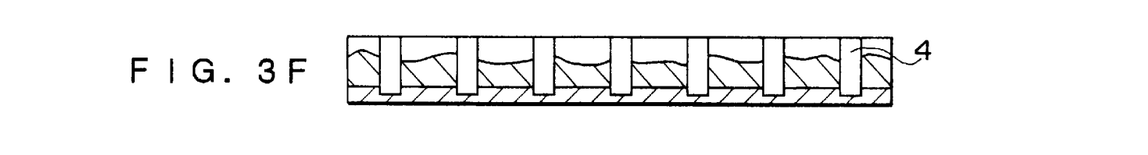

Next, as illustrated in FIG. 3F, the cutting grooves 4, which are of a thickness such that they extend through the entire thickness of the wafer 10 and about one-half of the thickness of the protective tape 3 for dicing, are inserted by a dicing device (not shown) such that the wafer 10 is divided into sizes of the respective semiconductor elements.

Figure 3G:
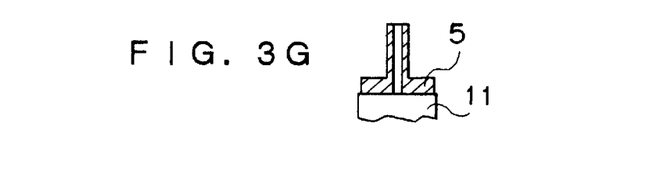

Then, the entire surface of the protective tape 3 for dicing is irradiated with UV light such that the adhesiveness of the protective tape 3 for dicing is deteriorated. Thereafter, as illustrated in FIG. 3G, the separate semiconductor elements 11 are picked up with the pick up tool 5 of a dice bonding device and are separated from the protective tape 3 for dicing.

Thereafter, a dice bonding process is carried out on the semiconductor elements 11. The assembly process is carried out, and packaging is completed. Description of the dice bonding process and processes thereafter will be omitted.

The same effects as those of the second embodiment are achieved by the third embodiment.

FIGS. 4A through 4H are cross-sectional views illustrating a fourth embodiment of the present invention, and show steps of a fabricating process up to the stage of separating a wafer into separate semiconductor elements. These steps are as follows.

Figure 4A:
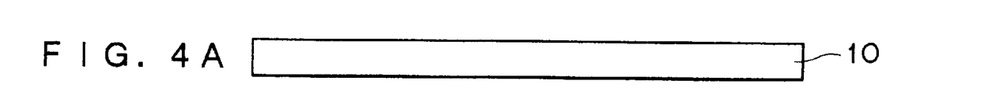
FIGS. 4A through 4H are cross-sectional views illustrating a fourth embodiment of the present invention.
Figure 4B:
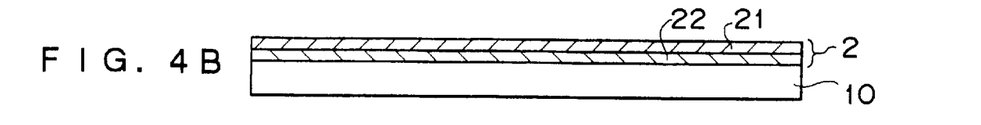
Figure 4C:
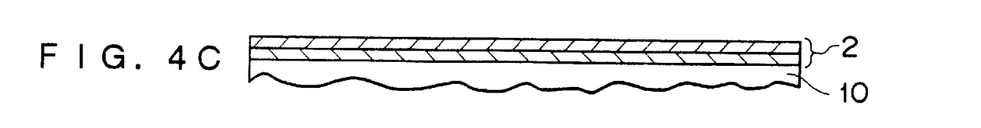

FIGS. 4A through 4C are the same as the second embodiment, and description thereof will therefore be omitted.

Figure 4D:
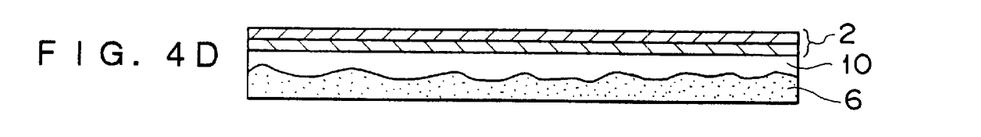

In FIG. 4D, with the protective tape 2 for back grinding adhered to the front surface of the wafer 10, the tape-shaped adhesive 6 for dice bonding is adhered to the reverse surface of the wafer 10 for which the back grinding processing has been completed. A thermoplastic resin or the like is used for the tape-shaped adhesive 6 for dice bonding.

Figure 4E:
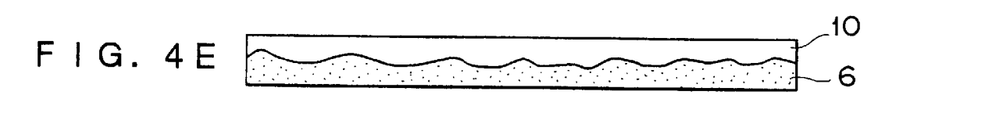

Thereafter, as illustrated in FIG. 4E, the protective tape 2 for back grinding is peeled off.

Figure 4F:
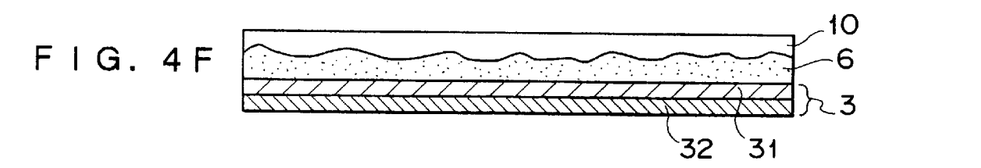

As shown in FIG. 4F, the protective tape 3 for dicing is adhered to the reverse surface of the cut wafer 10, in order to separate the wafer 10 into the respective semiconductor elements which are formed thereon.

Figure 4G:
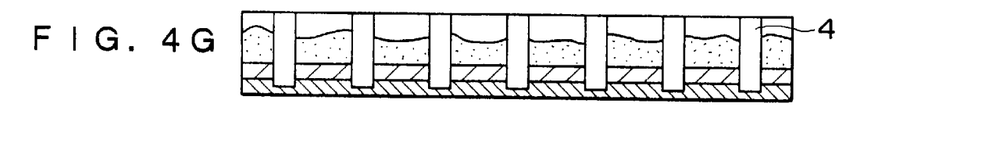

Next, as shown in FIG. 4G, the cutting grooves 4, which are of a thickness such that they extend through the entire thickness of the wafer 10, the entire thickness of the tape-shaped adhesive 6 for dice bonding, and about one-half of the thickness of the protective tape 3 for dicing, are inserted by a dicing device (not shown) such that the wafer 10 is divided into sizes of the respective semiconductor elements.

Figure 4H:
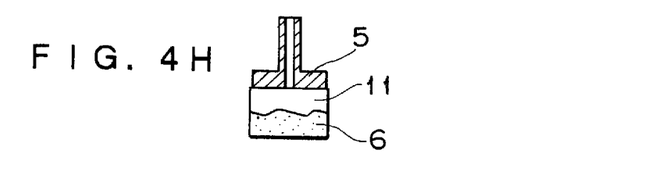

Then, the entire surface of the protective tape 3 for dicing is irradiated with UV light such that the adhesiveness of the protective tape 3 for dicing is deteriorated. Thereafter, as illustrated in FIG. 4H, the separate chips are picked up with the pick up tool 5 of a dice bonding device, and the semiconductor elements 11, with the tape-shaped adhesive 6 for dice bonding adhered thereto, are separated from the protective tape 3 for dicing.

Thereafter, although unillustrated, a dice bonding process is carried out on the semiconductor elements 11. Heat is applied such that dice bonding is carried out due to the adhesion of the tape-shaped adhesive 6 for dice bonding.

Thereafter, a known assembly process is carried out, and packaging is completed.

In accordance with the fourth embodiment, the following effects are obtained.

(1) Because probing is completed in the stages before the back grinding process, the wafer is still thick during probing, and breakage of the wafer due to the application of pressure from the probing needle can be prevented. Defects do not arise, and as a result, costs can be decreased.

(2) After the wafer has been subjected to back grinding processing to a desired thickness, because the tape-shaped adhesive for dice bonding is adhered to the wafer, the tape-shaped adhesive for dice bonding reinforces the wafer. Even if the wafer is thin, when the protective tape for back grinding is peeled, breakage of the wafer can be prevented. Defects do not arise, and as a result, costs can be decreased.

(3) When conveying the wafer through the respective processes, because the tape-shaped adhesive for dice bonding is adhered to the wafer, the tape-shaped adhesive for dice bonding reinforces the wafer. Even if the wafer is thin, breakage of the wafer can be prevented. Defects do not arise, and as a result, costs can be decreased.

(4) Because the wafer can be made thin, there is no need to make the wafer (the chip) thick, and thin packaging of the semiconductor elements is possible. Because there is no need to make the other materials (especially the package material covering the chip) thin, the quality, such as the moisture resistance, soldering resistance and the like, does not deteriorate.

(5) Because the tape-shaped adhesive for dice bonding is adhered to the semiconductor elements, there is no need to apply an adhesive when dice bonding the semiconductor elements.

FIGS. 5A through 5I are cross-sectional views illustrating a fifth embodiment of the present invention, and show steps of a fabricating process up to the stage of separating a wafer into separate semiconductor elements. These steps are as follows.

FIGS. 5A through 5D are the same as the fourth embodiment. Thus, description thereof will be omitted.

Figure 5A:
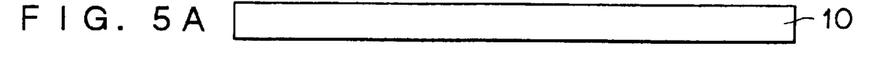
FIGS. 5A through 5H are cross-sectional views illustrating a fifth embodiment of the present invention.
Figure 5B:
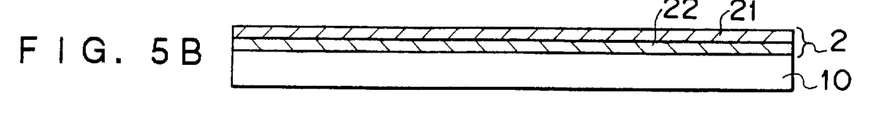
Figure 5C:
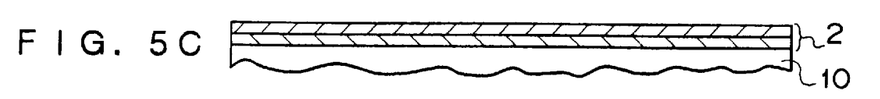
Figure 5D:
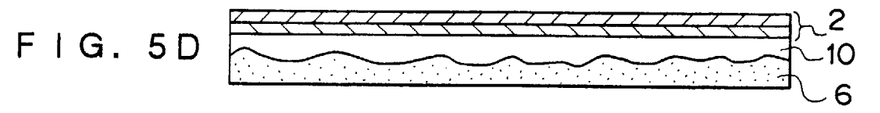
Figure 5E:
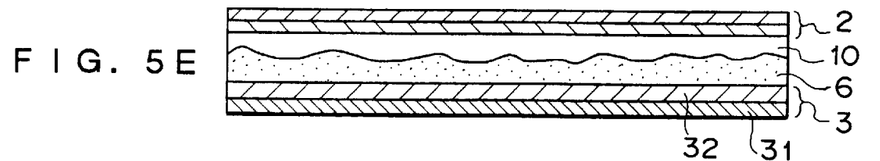

In FIG. 5E, in order to separate the wafer 10 into the plurality of semiconductor elements formed on the wafer 10, the wafer 10 is cut. The protective tape 3 for dicing is adhered to the reverse surface of the wafer 10 to which the tape-shaped adhesive 6 for dice bonding is adhered.

Figure 5F:
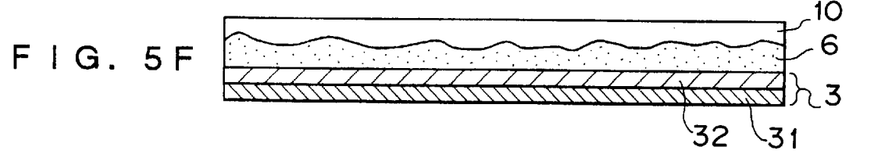

Then, as illustrated in FIG. 5F, the protective tape 2 for back grinding is peeled off.

Figure 5G:
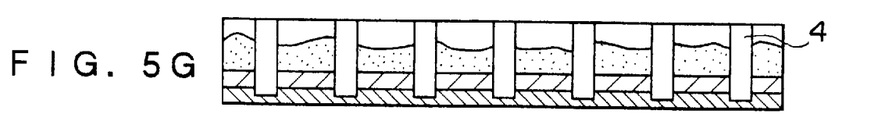

Then, as shown in FIG. 5G, the cutting grooves 4, which are of a thickness such that they extend through the entire thickness of the wafer 10, the entire thickness of the tape-shaped adhesive 6 for dice bonding, and about one-half of the thickness of the protective tape 3 for dicing, are formed by a dicing device (not shown) such that the wafer 10 is divided into sizes of the respective semiconductor elements.

Figure 5H:
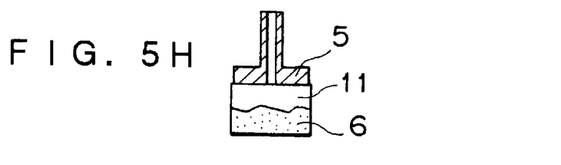

Then, the entire surface of the protective tape 3 for dicing is irradiated with UV light such that the adhesiveness of the protective tape 3 for dicing is deteriorated. Thereafter, as illustrated in FIG. 5H, the individual semiconductor elements 11 are picked up with the pick up tool 5 of a dice bonding device, and the semiconductor elements 11, with the tape-shaped adhesive 6 for dice bonding adhered thereto, are separated from the protective tape 3 for dicing.

Thereafter, although unillustrated, a dice bonding process is carried out on the semiconductor elements 11. Heat is applied and dice bonding is carried out due to the adhesion of the tape-shaped adhesive 6 for dice bonding.

Thereafter, a known assembly process is carried out, and packaging is completed.

In accordance with the fifth embodiment, the same effects as those of the fourth embodiment are obtained.

FIGS. 6A through 6H are cross-sectional views illustrating a sixth embodiment of the present invention, and show steps of a fabricating process up to the stage of separating a wafer into separate semiconductor elements. The respective steps are as follows.

FIGS. 6A through 6E are the same as the fifth embodiment, and therefore, description thereof will be omitted.

Figure 6A:
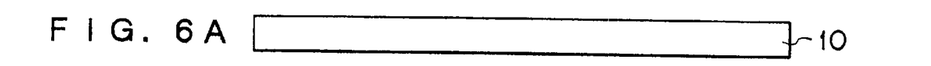
Figure 6B:
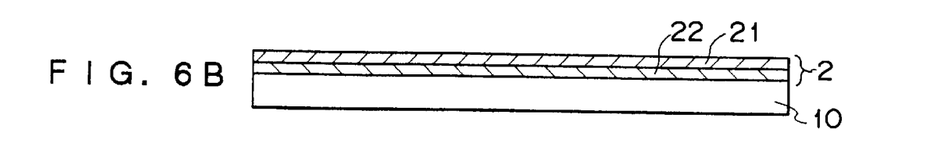
Figure 6C:
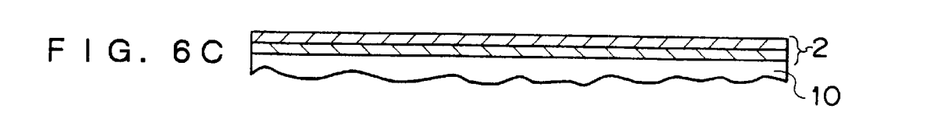
Figure 6D:
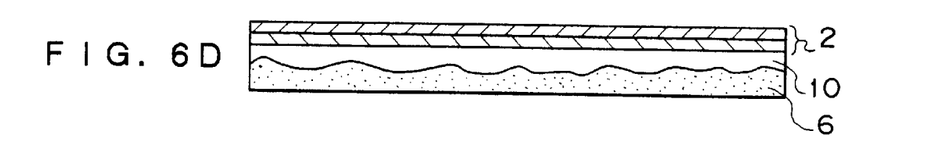
Figure 6E:
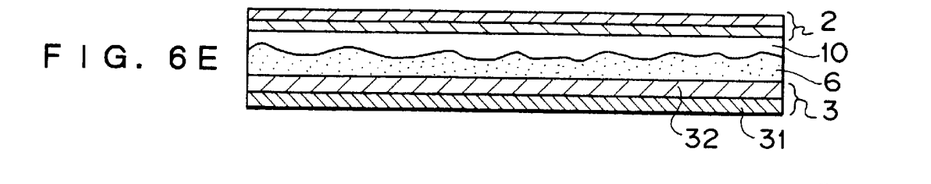
Figure 6F:
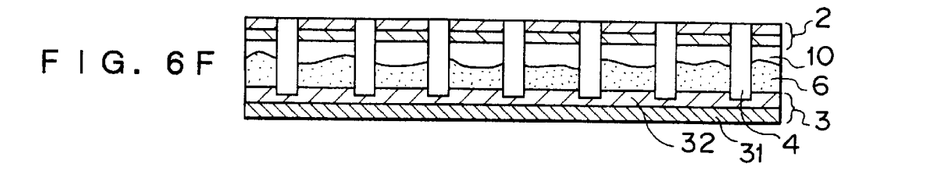

In FIG. 6F, the cutting grooves 4, which are of a thickness such that they extend through the entire thickness of the protective tape 2 for back grinding, the entire thickness of the wafer 10, the entire thickness of the tape-shaped adhesive 6 for dice bonding, and about one-half of the thickness of the protective tape 3 for dicing, are formed by a dicing device (not shown) such that the wafer 10 is divided into sizes of the respective semiconductor elements. At this time, the protective tape 2 for back grinding must be transparent to the extent that the scribe lines, which are provided for dividing the wafer 10 into the respective chips, can be seen.

Then, the entire surface of the protective tape 3 for dicing is irradiated with UV light such that the adhesiveness of the protective tape 3 for dicing is deteriorated. Thereafter, as illustrated in FIG. 6G, the individual chips are picked up with the pick up tool 5 of a dice bonding device, and the semiconductor elements 11, with the protective tape 2 for back grinding and the tape-shaped adhesive 6 for dice bonding adhered thereto, are separated from the protective tape 3 for dicing.

Thereafter, while the semiconductor elements 11 are picked-up by the pick up tool 5, or by using a dice bonding tool of a similar configuration, a known dice bonding process is carried out (not shown) on the semiconductor elements. Heat is applied and dice bonding is carried out due to adhesion of the tape-shaped adhesive 6 for dice bonding.

Then, as shown in FIG. 6H, the protective tape 2 for back grinding which is adhered to the semiconductor element 11 is peeled off by using a peeling tool of a configuration such as that of the pick up tool. If the adhesive 22 of the protective tape 2 for back grinding is a tacky resin, the adhered protective tape 2 for back grinding is peeled off mechanically by a peeling tool. If the adhesive 22 of the protective tape 2 for back grinding is a UV-curing resin, the adhered protective tape 2 for back grinding is peeled off by a peeling tool after being irradiated by UV light. If the adhesive 22 of the protective tape 2 for back grinding is a thermoplastic resin, the adhered protective tape 2 for back grinding is heated and peeled off by a peeling tool.

Thereafter, a known assembly process is carried out, and packaging is completed.

In accordance with the sixth embodiment, the following effects are obtained.

(1) Because probing is completed in the stages before the back grinding process, the wafer is still thick during probing, and breakage of the wafer due to the application of pressure from the probing needle can be prevented. Defects do not arise, and as a result, costs can be decreased.

(2) When conveying the wafer through the respective processes, because the protective tape for back grinding, the tape-shaped adhesive for dice bonding, and the protective tape for dicing are adhered before the wafer is separated into the respective semiconductor elements, the wafer is reinforced by these materials. Even if the wafer is thin, breakage of the wafer can be suppressed. Defects do not arise, and as a result, costs can be decreased.

(3) Because the wafer can be made thin, there is no need to make the wafer (the chip) thick, and thin packaging of the semiconductor elements is possible. Because there is no need to make the other materials (especially the package material covering the chip) thin, the quality, such as the moisture resistance, soldering resistance and the like, does not deteriorate.

(4) Because the tape-shaped adhesive for dice bonding is adhered, there is no need to apply an adhesive when dice bonding the semiconductor elements.

(5) Because the protective tape for back grinding exists on the semiconductor elements at the time of dice bonding the semiconductor elements, the tape functions to prevent the semiconductor elements from being scratched or the like, and as a result, the quality improves.

What is claimed is:

1. A method of fabricating a semiconductor device comprising the steps of:
   (a) preparing a wafer on which a plurality of semiconductor elements are formed;
   (b) adhering a protective tape for back grinding to a front surface of the wafer;
   (c) subjecting a reverse surface of the wafer to back grinding processing;
   (d) with the protective tape for back grinding adhered, adhering a tape-shaped adhesive for dice bonding to the reverse surface of the wafer for which back grinding processing has been completed;
   (e) after said adhering a tape-shaped adhesive for dice bonding, peeling off the protective tape for back grinding;
   (f) with the tape-shaped adhesive for dice bonding adhered, and after said peeling, evaluating electrical characteristics of each of the plurality of semiconductor elements on the wafer by inspection using a probing needle, and sorting the semiconductor elements into satisfactory semiconductor elements and non-satisfactory semiconductor elements;
   (g) after said evaluating, adhering a protective tape for dicing to the tape-shaped adhesive for dice bonding;
   (h) forming, by using a dicing device, cutting grooves extending from the front surface of the wafer through the tape-shaped adhesive for dice bonding to substantially one-half of a depth of the protective tape for dicing, and dividing the wafer into portions of sizes of the individual semiconductor elements;
   (i) separating, from the protective tape for dicing, the individual semiconductor elements to which the tape-shaped adhesive for dice bonding is adhered; and
   (j) subjecting the separated semiconductor elements to dice bonding by using the tape-shaped adhesive for dice bonding.

2. The method of fabricating a semiconductor device of claim 1, wherein the process of adhering the tape-shaped adhesive for dice bonding is the adhering of a tape-shaped adhesive for dice bonding formed from a thermoplastic resin.

3. The method of fabricating a semiconductor device of claim 1, wherein in the step of dice bonding the semiconductor elements, heat is applied to the semiconductor elements, and the semiconductor elements are dies bonded due to adhesion of the tape-shaped adhesive for dice bonding.

4. The method of fabricating a semiconductor device of claim 1, wherein the process of adhering the protective tape for back grinding is the adhering of a protective tape for back grinding which is formed from a tape substrate and an adhesive, and the adhesive is one of a tacky resin, a UV-curing resin, and a thermoplastic resin.

5. The method of fabricating a semiconductor device of claim 1, wherein the step of adhering the protective tape for dicing to the wafer is the adhering of a protective tape for dicing which is formed from a tape substrate and an adhesive.

6. The method of fabricating a semiconductor device of claim 4, wherein in the step of peeling off the protective tape for backing grinding, when the adhesive of the protective tape for back grinding is a tacky resin, the adhesiveness of the adhesive is deteriorated mechanically and the protective tape for back grinding is peeled off, and when the adhesive of the protective tape for back grinding is a UV-curing resin, the adhesiveness of the adhesive is deteriorated by irradiating UV light and the protective tape for back grinding is peeled off, and when the adhesive of the protective tape for back grinding is a thermoplastic resin, the adhesiveness of the adhesive is deteriorated by overheating and the protective tape for back grinding is peeled off.

7. The method of fabricating a semiconductor device of claim 5, wherein the forming of the cutting grooves is the forming of cutting grooves to a depth within the tape substrate of the protective tape for dicing.

8. A method of fabricating a semiconductor device comprising the steps of:
   (a) preparing a wafer on which a plurality of semiconductor elements are formed and in which electrical characteristics of each of the semiconductor elements is evaluated by inspection using a probing needle and the semiconductor elements have been sorted into satisfactory semiconductor elements and non-satisfactory semiconductor elements;
   (b) adhering a protective tape for back grinding to a front surface of the wafer;
   (c) subjecting a reverse surface of the wafer to back grinding processing;
   (d) with the protective tape for back grinding adhered, adhering a tape-shaped adhesive for dice bonding to the reverse surface of the wafer for which back grinding processing has been completed;
   (e) after said adhering a tape-shaped adhesive for dice bonding, adhering a protective tape for dicing to the tape-shaped adhesive for dice bonding;
   (f) peeling off the protective tape for back grinding;
   (g) forming, by using a dicing device, cutting grooves extending from the front surface of the wafer through the tape-shaped adhesive for dice bonding to substantially one-half of a depth of the protective tape for dicing, and dividing the wafer into portions of sizes of the individual semiconductor elements;

(h) separating, from the protective tape for dicing, the individual semiconductor elements to which the tape-shaped adhesive for dice bonding is adhered; and (i) subjecting the separated semiconductor elements to dice bonding by using the tape-shaped adhesive for dice bonding.

* * * * *